United States Patent
Ganapathy et al.

(10) Patent No.: US 6,874,039 B2
(45) Date of Patent: Mar. 29, 2005

(54) METHOD AND APPARATUS FOR DISTRIBUTED DIRECT MEMORY ACCESS FOR SYSTEMS ON CHIP

(75) Inventors: Kumar Ganapathy, Mountain View, CA (US); Ruban Kanapathippillai, Dublin, CA (US); Saurin Shah, Sunnyvale, CA (US); George Moussa, Sunnyvale, CA (US); Earle F. Philhower, III, Union City, CA (US); Ruchir Shah, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 273 days.

(21) Appl. No.: 09/949,461

(22) Filed: Sep. 7, 2001

(65) Prior Publication Data

US 2002/0038393 A1 Mar. 28, 2002

Related U.S. Application Data

(60) Provisional application No. 60/231,421, filed on Sep. 8, 2000.

(51) Int. Cl.[7] .............................................. G06F 13/28
(52) U.S. Cl. .............................. 710/28; 710/22; 710/23
(58) Field of Search ............................. 710/22, 23, 26, 710/28, 34, 107; 700/3; 370/253

(56) References Cited

U.S. PATENT DOCUMENTS

| 4,099,236 | A | 7/1978 | Goodman et al. |
| 4,490,785 | A | 12/1984 | Strecker et al. |
| 4,507,732 | A | 3/1985 | Catiller et al. |
| 4,701,841 | A | 10/1987 | Goodrich et al. |
| 4,779,190 | A | 10/1988 | O'Dell et al. |
| 4,782,439 | A | 11/1988 | Borkar et al. |

(Continued)

FOREIGN PATENT DOCUMENTS

| GB | 2 195 038 A | 3/1988 |
| WO | WO 01/29656 A2 | 4/2001 |
| WO | WO 01/48976 A2 | 7/2001 |

OTHER PUBLICATIONS

Joseph D. Greenfield; Practical Digital Design Using IC's, pp. 546–553; John Wiley & Sons, 1977.

John P. Hayes; Computer Architecture and Organization, pp. 418–447; McGraw–Hill Book Company, 1978.

(Continued)

*Primary Examiner*—Fritz Fleming
*Assistant Examiner*—Joshua D Schneider
(74) *Attorney, Agent, or Firm*—Blakely, Sokoloff, Taylor & Zafman LLP

(57) ABSTRACT

A distributed direct memory access (DMA) method, apparatus, and system is provided within a system on chip (SOC). DMA controller units are distributed to various functional modules desiring direct memory access. The functional modules interface to a systems bus over which the direct memory access occurs. A global buffer memory, to which the direct memory access is desired, is coupled to the system bus. Bus arbitrators are utilized to arbitrate which functional modules have access to the system bus to perform the direct memory access. Once a functional module is selected by the bus arbitrator to have access to the system bus, it can establish a DMA routine with the global buffer memory.

3 Claims, 8 Drawing Sheets

U.S. PATENT DOCUMENTS

| | | |
|---|---|---|
| 4,853,846 A | 8/1989 | Johnson et al. |
| 4,982,321 A | 1/1991 | Pantry et al. |
| 5,109,517 A | 4/1992 | Houda et al. |
| 5,175,826 A | 12/1992 | Begun et al. |
| 5,359,717 A | 10/1994 | Bowles et al. |
| 5,414,820 A | 5/1995 | McFarland et al. |
| 5,506,973 A | 4/1996 | Okazawa et al. |
| 5,619,729 A | 4/1997 | Bland et al. |
| 5,644,784 A | 7/1997 | Peek |
| 5,664,197 A | 9/1997 | Kardach et al. |
| 5,708,849 A | 1/1998 | Coke et al. |
| 5,729,762 A | 3/1998 | Kardach et al. |
| 5,749,092 A | 5/1998 | Heeb et al. |
| 5,751,270 A | 5/1998 | Rhodes et al. |
| 5,761,532 A | 6/1998 | Yarch et al. |
| 5,794,070 A | 8/1998 | Rabe et al. |
| 5,802,269 A | 9/1998 | Poisner et al. |
| 5,805,842 A | 9/1998 | Nagaraj et al. |
| 5,828,903 A | 10/1998 | Sethuram et al. |
| 5,862,387 A | 1/1999 | Songer et al. |
| 5,870,628 A | 2/1999 | Chen et al. |
| 5,875,351 A | 2/1999 | Riley |
| 5,890,012 A | 3/1999 | Poisner |
| 5,894,560 A | 4/1999 | Carmichael et al. |
| 5,898,694 A * | 4/1999 | Ilyadis et al. ............... 710/107 |
| 6,003,122 A | 12/1999 | Yarch et al. |
| 6,081,851 A | 6/2000 | Futral et al. |
| 6,108,743 A | 8/2000 | Debs et al. |
| 6,122,679 A | 9/2000 | Wunderlich |
| 6,151,654 A | 11/2000 | Poisner et al. |
| 6,157,970 A | 12/2000 | Gafken et al. |
| 6,182,165 B1 | 1/2001 | Spilo |
| 6,192,428 B1 | 2/2001 | Abramson et al. |
| 6,219,583 B1 * | 4/2001 | Kinoshita et al. .............. 700/3 |
| 6,260,081 B1 | 7/2001 | Magro et al. |
| 6,275,242 B1 | 8/2001 | Shah et al. |
| 6,317,799 B1 | 11/2001 | Futral et al. |
| 6,385,671 B1 | 5/2002 | Hunsaker et al. |
| 6,430,628 B1 | 8/2002 | Connor |
| 6,449,259 B1 * | 9/2002 | Allain et al. ................ 370/253 |
| 6,622,183 B1 * | 9/2003 | Holm ......................... 710/34 |

OTHER PUBLICATIONS

M. Morris Mano; Digital Logic and Computer Design, pp. 547–552; Prentice–Hall, Englewood Cliffs, NJ, 1979.

John Mick & James Brick; Bit–Slice Microprocessor Design, Chapter VII, pp. 239–256, McGraw–Hill Book Company, 1980.

Jean–Loup Baer; Computer Systems Architecture; pp. 386–401; Computer Science Press, Inc., Rockville, Maryland; 1980.

Encyclopedia of Computer Science and Engineering, 2nd Edition, pp. 285–288; Van Nostrand Reinhold Company, Inc., 1983.

David A. Patterson & John L. Hennessy; Computer Architecture A Quantitative Approach, pp. 533–538, Morgan Kaufmann Pub Inc., San Mateo, CA 1990.

Richard C. Dorf; The Electrical Engineering Handbook, pp. 1804–1807 & 1868–1869; CRC Press, Boca Raton, FL, 1993.

* cited by examiner

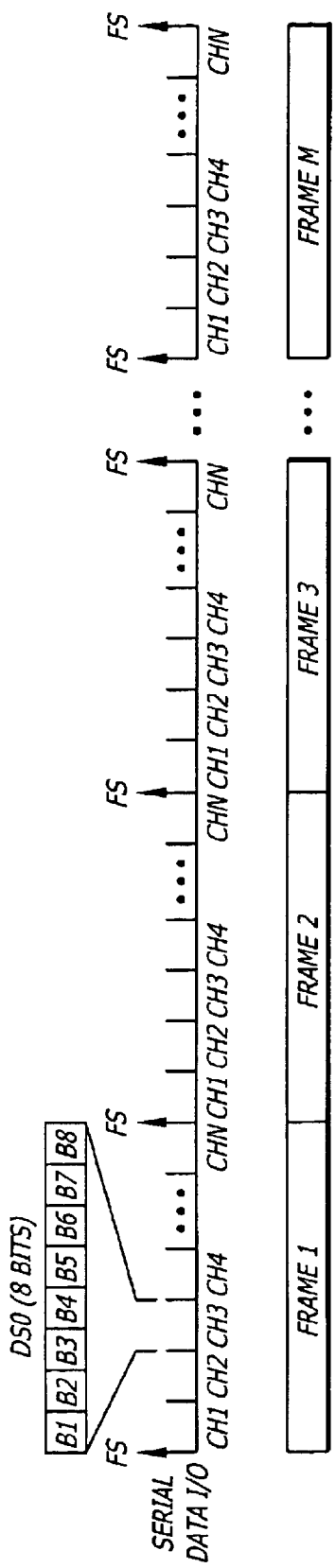
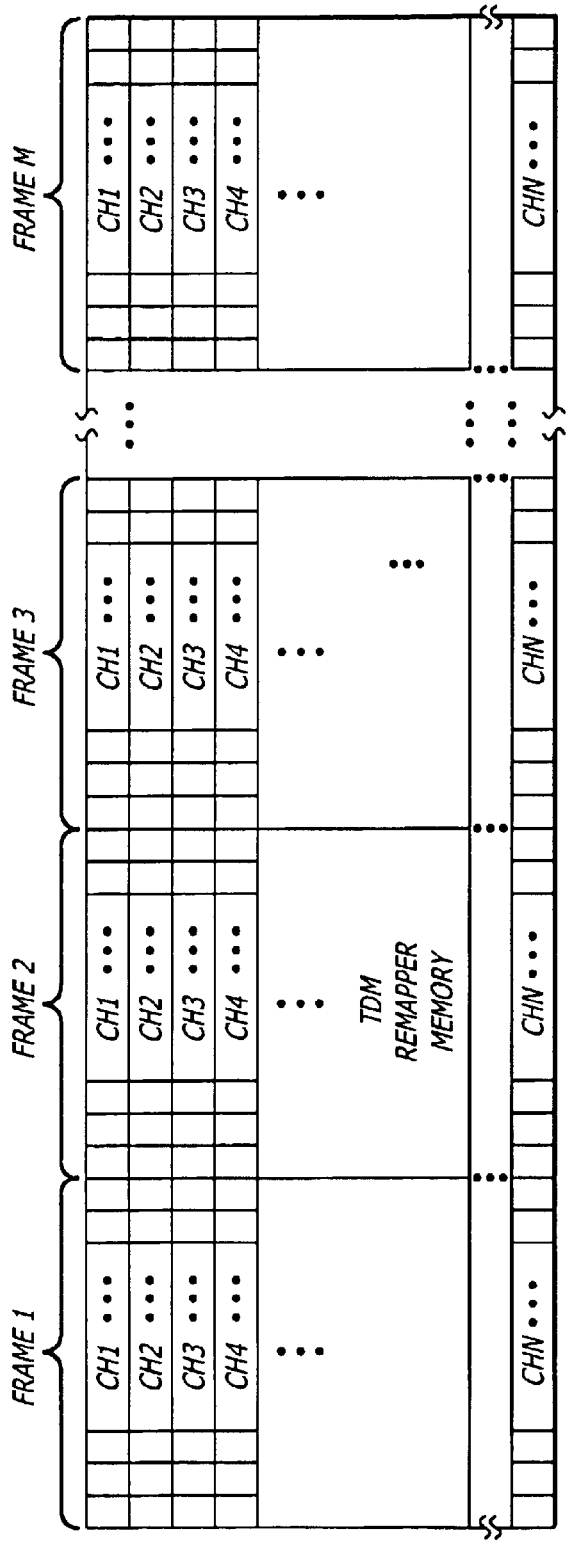
FIG. 6A
FIG. 6B

METHOD AND APPARATUS FOR DISTRIBUTED DIRECT MEMORY ACCESS FOR SYSTEMS ON CHIP

CROSS REFERENCE TO RELATED APPLICATIONS

This United States (U.S.) non-provisional patent application claims the benefit of U.S. provisional Patent Application No. 60/231,421 entitled "METHOD AND APPARATUS FOR DISTRIBUTED DIRECT MEMORY ACCESS FOR SYSTEMS ON CHIP", filed Sep. 8, 2000 by Ganapathy et al, both of which are to be assigned to Intel Corporation.

FIELD OF THE INVENTION

This invention relates generally to direct memory access controllers. More particularly, the invention relates to direct memory access for a system on chip.

BACKGROUND OF THE INVENTION

Within a computer system there are generally three methods of data transfer between main memory or the registers of a central processing unit (CPU) and input/output (I/O) devices over a system bus. These three methods are programmed I/O, interrupt driven I/O, and direct memory access (DMA). With programmed I/O and interrupt driven I/O, the CPU is responsible for obtaining data from main memory for transfer to the I/O devices and for obtaining data from the I/O devices for transfer to main memory over the system bus. Thus, the programmed I/O and interrupt driven I/O requires the direct involvement of the CPU which ties it up managing the data transfer so that it can not otherwise perform other more important functions.

Direct memory access (DMA) was introduced which required a centralized DMA controller to alleviate the CPU involvement in data transfer. Centralized DMA control is well known. The centralized DMA controller essentially took over the role of transferring data over the system bus between main memory and I/O devices. In DMA accesses, the CPU involvement was reduced to the initial setting up of the DMA transfer and the clean up at the completion of the DMA transfer. While the actual DMA data transfer was being controlled by the DMA controller, the CPU could perform other computations or functions. As a result, DMA data transfer were more efficient than either programmed I/O or interrupt driven I/O methods. In order to avoid collisions on the system bus, the DMA control was centralized into a centralized DMA controller. The centralized DMA controller performed arbitration of the system bus to the attached I/O devices allowing only one at a time to be transferring data between it and the main memory. Furthermore, when multiple I/O devices desired to perform a DMA access simultaneously, the centralized DMA controller had to perform some prioritization method. As a result, the control logic of the centralized DMA controller can be rather complicated which can lead to a rather large block size for the circuitry of a centralized DMA controller.

Improved semiconductor manufacturing techniques have been shrinking the feature sizes in integrated circuits, such as transistor channel lengths. The smaller transistors have allowed more complicated integrated circuit chips to be constructed such that functional systems can now be formed within a single integrated circuit chip and produce satisfactory yields. These functional systems, which are substantially complete systems, are oftentimes referred to as a system on chip (SOC). In an SOC, there may be many functional blocks that require transferring data to or from a memory. Additionally, it is oftentimes desirable when constructing an SOC, to make it flexible so that the number of functional blocks can be expanded to handle more data and/or add other types of functional blocks. As the number of functional blocks increases, potential arbitration problems may arise in an SOC. A disadvantage to using centralized DMA controller in this case is that the control logic may need to be redesigned to provide for the expansion.

BRIEF DESCRIPTIONS OF THE DRAWINGS

FIG. 6A is an exemplary serial data stream of frames of data transmitted or received through the multichannel serial port of FIG. 2.

FIG. 6B is an exemplary ramapping of frames of data for the multichannel serial port performed by the TDM remapper memory of FIG. 5.

Like reference numbers and designations in the drawings indicate like elements providing similar functionality. A letter after a reference designator number represents an instance of an element having the reference designator number.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

A distributed direct memory access (DMA) method, apparatus, and system is provided within a system on chip (SOC). DMA controller units are distributed to functional modules which desire direct memory access with a global buffer memory. The DMA controller units arbitrate which functional block has access to the global buffer memory. The functional modules interface to a system bus over which the direct memory access occurs. The global buffer memory, to which the direct memory access is desired, is coupled to the system bus. Bus arbitrators are utilized to arbitrate which functional modules have access to the system bus to perform the direct memory access. Once a functional module is selected by the bus arbitrator to have access to the system bus, it can establish a DMA routine with the global buffer memory.

Figure 1:
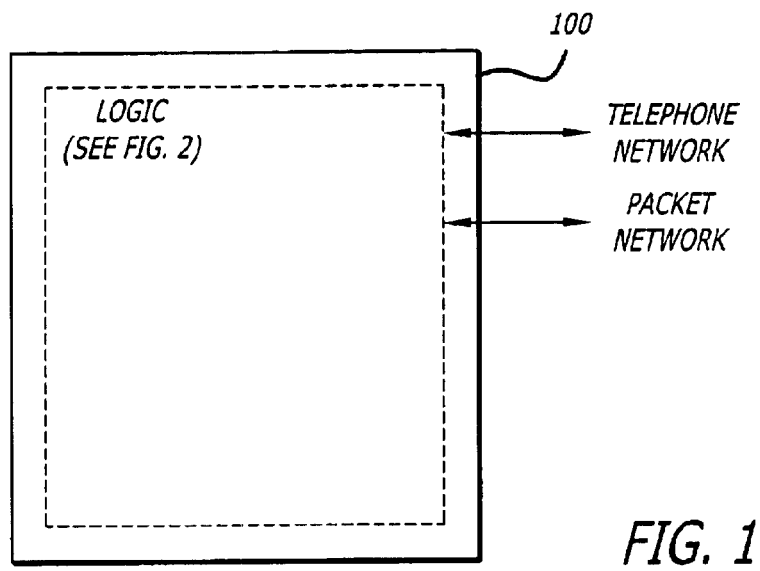
FIG. 1 is a block diagram of a system on a chip of the present invention.

Referring now to FIG. 1, a block diagram of a system on a chip (SOC) is illustrated. The system on a chip (SOC) 100 in one embodiment is a voice over packet (VOP) system including a multichannel full duplex serial port to interface to a telephone network over one connection and another port to interface to a packet network through another connection. The telephone network in one embodiment is a PSTN telephone network having a TDM serial data stream.

Figure 2:
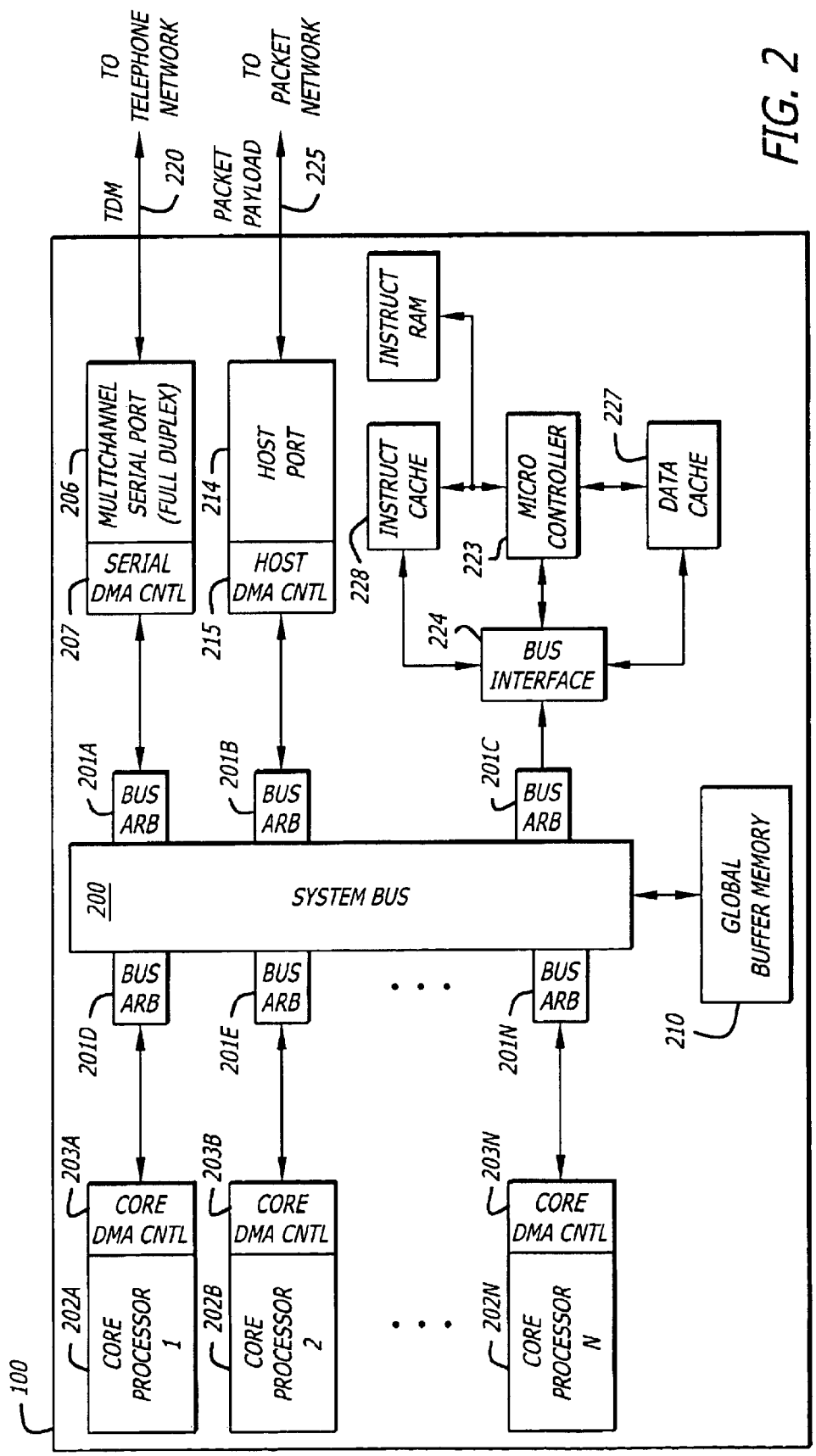
FIG. 2 is a detailed block diagram of a voice over packet (VOP) system on a chip of the present invention.

Referring now to FIG. 2, a detailed block diagram of the voice over packet system on a chip (VOP SOC) 100 is illustrated. The voice over packet system on a chip 100 has a central system bus 200 coupled to a global buffer memory 210. The system bus 200 is a standardized system bus which includes conductive traces or wires for address signals, data signals and control signals. The address lines are used by the bus to perform DMA transfers. The bus multiplexes a number of DMA transactions concurrently, and only deals with one transaction at a time. So it needs a set of address lines for that transfer (read or write). The address and data lines are distinct. The bus width of the system bus 200 for the data signals has a data system bus width (DSBW) of sixty four bits in one embodiment. A sixty four bit wide data system bus width facilitates high bandwidth data transfers. Access to the central system bus 200 by function modules of the system on a chip 100 is arbitrated by bus arbitrators 201A–201N coupled to the system bus 200 using a uniform programmable arbitration protocol. The standardized system bus 200 and the uniform arbitration protocol supplied by the bus arbitrators 201A–201N simplifies arbitration of the system bus 200. In order to gain access to the global buffer memory 210, the functional modules of the system on a chip 100 must first gain access to the system bus 200 through bus arbitrators 201A–201N. A round-robin arbitration scheme on the system bus 200 assures that each of the distributed DMA master controllers 203A–203N, 207 and 215 have access every so often to the system bus 200 and can access the global memory 210 at that time.

All code, data and state information for the VOP SOC 100 is stored into and read from the global buffer memory 210 which acts as a central depository. Thus, data bandwidth is important and it is desirable to efficiently transfer information into and out of the global buffer memory 210 over the system bus 200 using a distributed direct memory access (DMA) system of the present invention. While the bus arbitrators arbitrate access to the system bus, the distributed DMA system arbitrates access to the global buffer memory 210. The global memory 210 is a slave to the distributed DMA master controllers in the system on chip 100 and includes a slave DMA interface. The global buffer memory 210 responds to the DMA transfer requests over the system bus 200 initiated by the distributed DMA controllers. The distributed DMA system allows the functional modules to generate their own addresses for the global buffer memory and avoids instructions from constantly being sent every cycle to access large blocks of data. A register is set up during a DMA that allows addresses to be automatically generated and multiple data blocks or bytes to be accessed in sequence. The functional modules of the system on a chip 100 desiring direct memory access to the global buffer memory 210 include, one or more core signal processors 202A–202N, a multi-channel full duplex serial port 206 to interface to a telephone network, and a host port 214 to interface to a host and a packet network. The global buffer memory 210 of the SOC 100 is directly coupled to the central system bus 200.

The modules of the system on a chip 100 desiring direct memory access to the global buffer memory 210 have their own direct memory access (DMA) controllers but for the micro controller 223. The microcontroller 223 couples to the system bus 200 through a bus interface 224 and a bus arbitrator 201C. The microcontroller 223 acts as a system or executive manager orchestrating the scheduling of tasks and flow of data from the serial port 206 and the host port 214.

It does not require a DMA controller, but does generate cache line misses for instruction and data that are routed to the global memory 210. The microcontroller has a data cache 227 and an instruction cache 228 associated with it that cause the generation of the cache line misses. The microcontroller sets up DMA descriptors and instructs the individual functional units of the SOC 100 to perform the DMA transfers. The bus arbitrator 201C and the bus interface 224 talk to each other for the microcontroller to gain access to the system bus. The microcontroller 223 provides job control and orchestrates the data transfers into and out of the global buffer memory 210 acting like a data traffic cop. The microcontroller 223 sets up a DMA by writing a DMA descriptor list into the global buffer memory regarding the DMA data transfer. It then communicates to the functional unit to perform the DMA of the data by pointing to the starting address of the DMA descriptor list. The functional unit then reads the DMA descriptor list and performs the DMA of the data. The DMA descriptor list includes a starting address for the data and the number of bytes to be transferred. The DMA descriptor list includes other information which is described in greater detail below. The one or more core processors 202A–202N can also form DMA descriptors in the global memory 210 especially for core DMA transfers, in addition to the microcontroller 223. As an example, the microcontroller 223 sets up a DMA with one of the core processors 202A–202N in order to process a frame or block of data for a given communication channel. It communicates with the one core processor the starting address of the descriptor list in the global buffer memory. The one core processor reads through each line in the descriptor list and performs the DMA of the data from the global buffer memory into the core processor's local memory.

The multi-channel serial port 206 interfaces to multiple full duplex time division multiplexed (TDM) telecommunication channels in order for the VOP SOC 100 to support multiple communications channels. The multi-channel serial port 206 acts as a receiver and transmitter for each of multiple communications channels which is on the order of 512 channels. Data received from the telephone network is stored by the multi-channel serial port 206 into the global buffer memory 210 for processing by the core processors 202A–202N. Data to be transmitted onto the telephone network after processing by the core processors 202A–202N, is retrieved by the multi-channel serial port 206 from the global buffer memory 210. To access the global buffer memory directly, the multi-channel serial port 206 includes a serial DMA controller 207 that couples to bus arbitrator 201A.

The host port 214 couples to a host to receive external data upon power up and set up information regarding the communication channels which it will process. Additionally, the host port 214 couples to a packet network to transceive packet payloads of data in full duplex for multiple communication channels. Data received from the packet network is stored by the host port 214 into the global buffer memory 210 for processing by the core processors 202A–202N. Data to be transmitted onto the packet network after processing by the core processors 202A–202N, is retrieved by the host port 214 from the global buffer memory 210. The packet payloads transceived by the host port 214 are packetized prior to transmission over the packet network and are depacketized after being received from the packet network into the packet payload data received through the host port. Alternatively, a packetizer and depacketizer can be included in the VOP SOC 100 to directly interface to a packet network.

In one embodiment, the host port 214 also implements the protocols of an Intel I960 compatible host port. The host port 214 couples to a host such an Intel I960 host processor in order to receive external information because the global buffer memory 210 is internal to the system on a chip 100. The host provides information through the host port 214 regarding a boot up sequence during boot up of the SOC 100 as well as channel set up information regarding the communication channels the SOC 100 is to support and any other external information a user needs to load into the SOC 100. The host port 214 in one embodiment includes a thirty two bit wide parallel data port. That is, the packet payload data and other information can flow from an external source into and out of the host port using a thirty two bit data word width. The host port 214 converts 32 bit data on the external bus into 64 bit data for transmission over the system bus 200 and 64 bit data from the system bus 200 into 32 bit data for transmission out the host port.

The core processors 202A–202N process the received TDM signals from the telephone network and can generate TDM signals in response for communication back over the telephone network or they can generate packet payloads for communication over the packet network. Packet payloads received from the packet network are processed by the core processors 202A–202N into packet payloads for transmission back over the packet network or into TDM data for communication over the telephone network. In any case, the data that needs processing is stored into the global buffer memory 210 first. The one or more core processors 202A–202N then retrieve the data for the given channel for processing. After processing is finished on the data by the one or more core processors 202A–202N it is stored into the global buffer memory 210. To access the global buffer memory directly, the one or more core processors 202A–202N include one or more core DMA controllers 203A–203N to DMA the data into their local memory. The code associated with the functional processing of the channel and the state information for prior processing of the channel and its data samples is also stored in the global buffer memory 210 and DMA transferred into the local memory (program memory and data memory) of the one of the one or more core processors that will process the new data samples.

Figure 3:
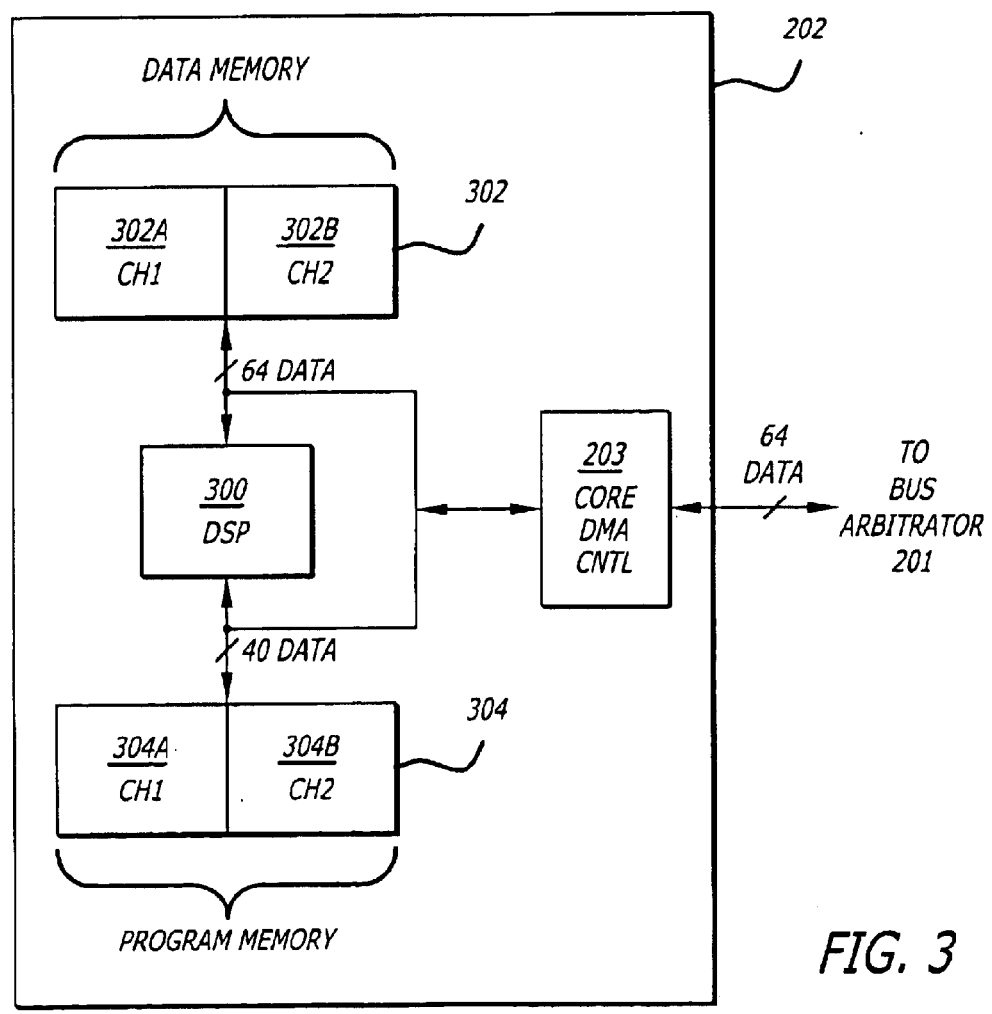
FIG. 3 is a block diagram of an instance of a core processor including a core direct memory access (DMA) controller illustrated in FIG. 2.

Referring now to FIG. 3, a block diagram of a core processor 202 is illustrated. The core processor 202 illustrated in FIG. 3 represents one instance of the one or more core processors 202A–202N in FIG. 2. The core processor 202 includes a core DMA controller 203, a digital signal processor (DSP) 300, the data memory 302, and a program memory 304 coupled together as shown in FIG. 3. Memory locations in the data memory 302 and the program memory 304 can be allocated into dual channels for processing two communication channels. Allocating memory locations into two channels in this fashion is sometimes referred to as a double buffered memory scheme. That is the data memory 302 can be viewed as split over two channels, a channel one data memory 302A and a channel two data memory 302B. Similarly the program memory 304 can be viewed as split into two channels, a channel one program memory 304A and a channel two program memory 304B. The channel one program memory 304A corresponds to the channel one data memory 302A. The channel two program memory 304B corresponds to the channel two data memory 302B.

The core DMA controller 203 and the DSP 300 ping-pong between which of the memory channels each are accessing. The core DMA controller 203 writes data or code into the memory locations of the data memory and program memory corresponding to the channel that is not being processed. While one channel of memory locations is being processed by the DSP 300, the other channel of memory locations is being read out or updated by DMA. For example, the DSP 300 processes the data in channel one 302A of the data memory 302 using the code stored in channel one 304A of the program memory 304B. While the DSP 300 is processing channel one, the core DMA controller 203 is updating channel two 302B of the program memory 304B to process a next channel. The core DMA controller 203 may also read out data from channel two after processing is completed and then update channel two 302B with new data for processing the next channel. The core DMA controller 203 transfers code and data between the global buffer memory 210 and the data memory 302 and program memory 304 using direct memory access.

The transfer of data between the data memory 302 and the core DMA controller 203 is by means of opportunistic reads and writes. That is at every opportunity, data is being transferred between a data memory 302 of the one or more core processors 200A–200N and the core DMA controller 203. If a processor is not using either port of the dual-ported data memory 302, data can be written into either port or read from either port. Whenever a free memory location(s) is available to write data into a bank that is being processed, the DMA process can write into the free memory location(s). After a memory location contains data that has completed processing, the DMA process can read from the memory location(s) in the data memory 302 when available. The core processors 200A–200N have a higher priority to access the memory banks, and the DMA controller cycle steals to get access to the data memory for opportunistic reads and writes. Similarly, the transfer of code between the program memory 304 and the global buffer memory 210 is by means of opportunistic reads and writes.

The instructions for DMA transfer between a data memory 302 and the global buffer memory 210 include start, stop, continue, suspend, and resume. There are DMA descriptor registers in the DMA controllers 203. One or more of these instructions can be written into the DMA descriptor registers while the DMA is in progress and can cause the appropriate action to be performed. A DMA transfer can also be stopped by a user using the stop command or the suspend command. After a DMA transfer is stopped, it can be continued by using the continue instruction. After stopping or suspending, a user may start another DMA transfer process. After suspending, a suspended DMA transfer can be resumed using the resume command. Upon reaching completion of the DMA process, an interrupt signal is coupled back to indicated to the host, the microcontroller, or core processor (DSP) to check the status of the DMA controller.

The bit width of the words of data stored into either channel of the data memory 302 matches that of the data system bus width (DSBW) of the system bus 200. It is desirable that the bit width of the words of code stored into either channel of the program memory 304 matches that of the instruction width of the DSP 300. In one embodiment, the width of words of data stored into either channel of the data memory 302 is sixty four bits wide while the width of words of program code stored into the either channel of the program memory 304 is forty bits wide. Thus, the core DMA controller 203 also converts (i.e. selectively packs) 64 bits of program code received from the global buffer memory 210 into forty bit word widths. The DMA controller presents 40-bits at a time to the DSP. The FIFO included in the core DMA controller 203 performs the 64-to-40 bit conversions. Every five words of sixty four bits (a total of 320 bits) of code read from the global buffer memory 210 is converted into eight words of forty bits (a total of 320 bits) of code. That is the bits are packed into a word which is the least common denominator between the data system bus width and the word width of the program memory 304.

Each of the distributed DMA controllers provide a source address to the global buffer memory when reading and a destination address to the global buffer memory when writing. The core DMA controller 203 also generates a destination address for the data memory 302 and program memory 304 when writing thereto or a source address when reading therefrom. The program memory 304 is 40-bit addressable having an address word that can be 40-bits wide. The data memory 302 is 64 bit addressable having an address word into memory that can be 64-bits wide. Thus, the core DMA controller 203 provides both source and destination address when performing DMA transfers between the global buffer memory 210 and the data memory 302 or program memory 304.

Figure 4:
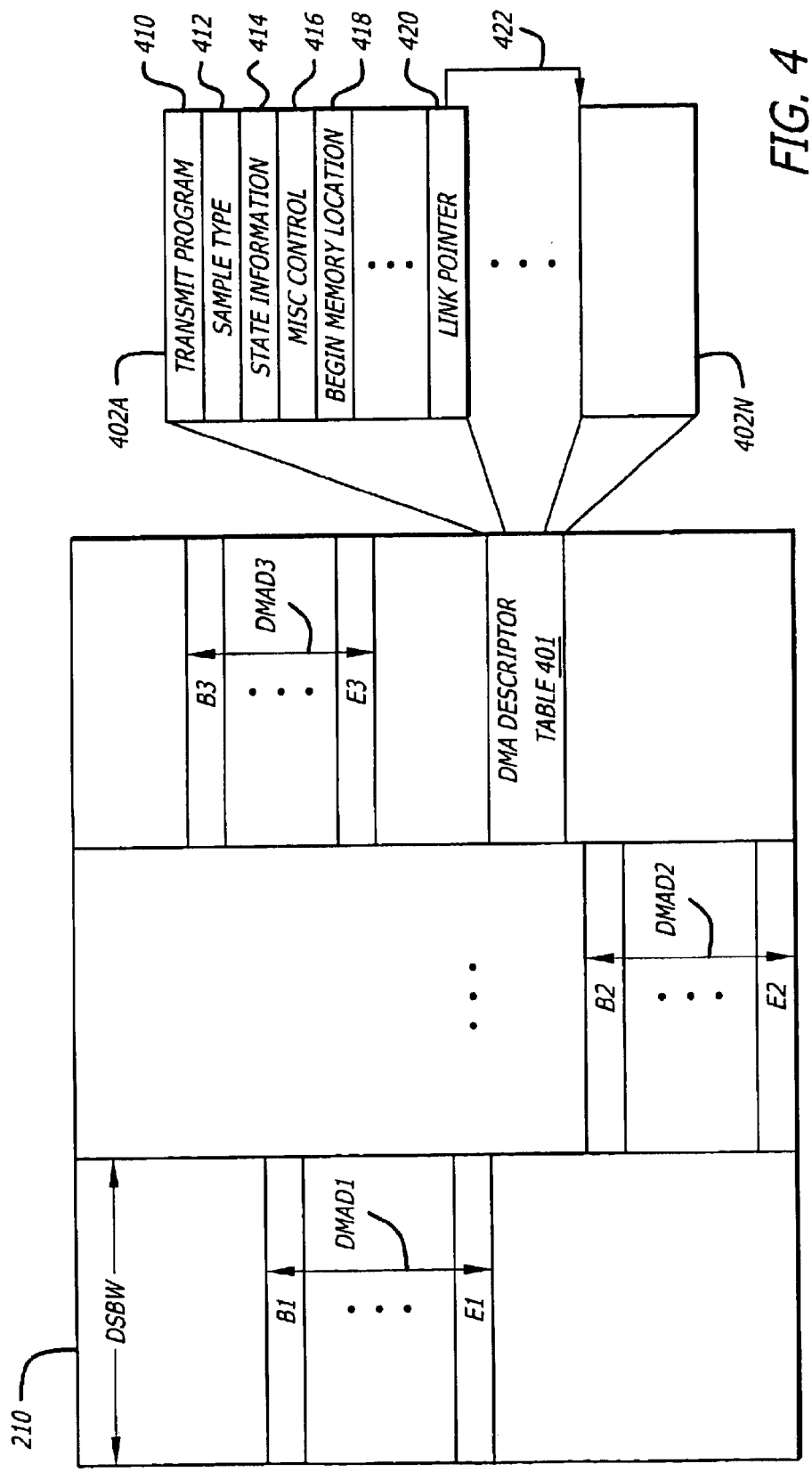
FIG. 4 is an exemplary memory map diagram of the global buffer memory including DMA data having beginning and ending DMA address locations and a DMA descriptor table describing the DMA data stored in the global buffer memory.

Referring now to FIG. 4, a block diagram of an exemplary memory map for the global buffer memory 210 is illustrated. A word or block of data is stored into and read out from the global buffer memory having a size that matches the data system bus width (DSBW). In one embodiment, the data system bus width and the width of data words into addressable memory locations in the global buffer memory is sixty four bits. That is, when an address is provided to the global buffer memory, sixty four bits can be read out all at once or written into all at once. The global buffer memory is addressable on 64-bit boundaries with an address word that is 23-bits wide.

In the exemplary memory map of FIG. 4, the global buffer memory 210 includes data between a first beginning address B1 and first ending address E1 as one set of direct memory accessible data (referred to as DMAD 1). DMAD 1 for example represents data that has been received from the host port or the multichannel serial port or data that has been written by one of the core processors 200A–200N. The exemplary memory map of FIG. 4 also includes data between a second beginning address B2 and second ending address E2 as a second set of direct memory accessible data (referred to as DMAD 2). The exemplary memory map of FIG. 4 also illustrates the global buffer memory 210 as including data between a third beginning address B3 and a third ending address E3 as a third set of direct memory accessible data (referred to as DMAD 3).

Global buffer memory also includes a DMA descriptor table 401. The DMA descriptor table 401 has one or more DMA descriptive lists 402A–402N of information which refer to the direct memory accessible data stored in the global buffer memory 210. One or more DMA descriptive list are used by each of the distributed DMA controllers when DMA transferring information with the global buffer memory 210. Each of the DMA descriptive lists 402A–402N include starting pointers to data, code, status or other information in the global buffer memory. One or more DMA descriptive lists 402A–402N within the DMA descriptive table 401 point to the direct memory accessible data of DMAD 1, DMAD 2 and DMAD 3. After the direct memory accessible data is no longer valid or usable, the DMA descriptive lists are invalidated or cleared.

In FIG. 4, the DMA descriptor table 401 includes an exemplary DMA descriptive list 402 A stored within the global buffer memory 210 to process a given channel. A DMA descriptive list 402N may have already been used by the serial DMA controller or host DMA controller to DMA information from their respective ports into the global buffer memory. The same DMA descriptive list can be used to DMA information from the global buffer memory into the local memory, the data memory and program memory, of one or more of the core processors 200A–200N. In which case, the DMA descriptive list may include a link to DMA descriptive list 402N.

FIG. 4 illustrates an exemplary DMA descriptive list 402A to process a channel. The exemplary DMA descriptive list 402A includes a transmit program pointer 410, a sample type description 412, state information pointer 414, miscellaneous control pointer 416, a beginning data memory pointer 418, and a linked list pointer 420. The transmit program pointer 410 points to a starting address for code that is to be used to process the given channel. The sample type description 412 describes the type of data samples on the serial port whether they are 4-bit, 8-bit, 16-bit and whether or not they are compressed and if so what type of compression is being used. The state information pointer points to the data in memory, if any, of the last state of computations of data samples for the channel which may be used in the current computation. The miscellaneous control pointer 416 points to miscellaneous control information regarding the data samples, the code, state information or other information that is to be direct memory accessed into or out of the global buffer memory 210. The beginning memory location 418 provides the beginning address of the data to be direct memory accessed pointing to the first word or block of data such as B1, B2 or B3 of the exemplary memory map. Alternatively, the linked list pointer 420 can point 422 to another DMA descriptive list 420N for the data or other information that needs to be directly memory accessed from or to the global buffer memory. In this manner DMA descriptor lists can be chained together.

Figure 5:
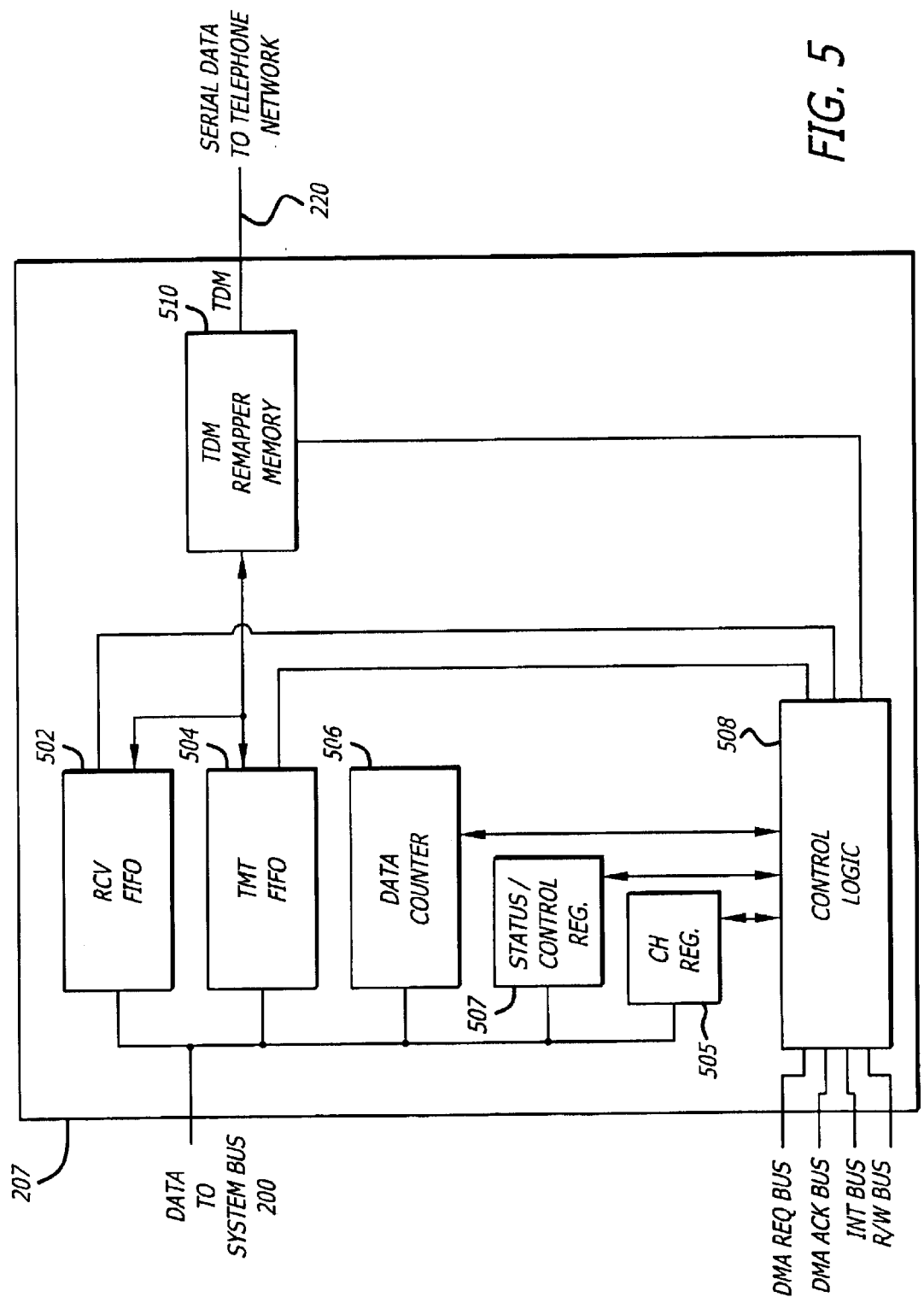
FIG. 5 is a block diagram of a serial DMA controller of FIG. 2.

Referring now to FIG. 5, a block diagram of the serial DMA controller 207 is illustrated. The serial DMA controller 207 includes a receive FIFO buffer 502, a transmit FIFO buffer 504, a channel register 505, a data counter 506, a status/control register 507, control logic 508, and a TDM remapper memory 510. The data transmitted and received over the serial port may be compressed by a compression algorithm. In the case of the data being voice data, the compression algorithm may be A-law compression or Mu-law compression. The voice data in its non-compressed form is PCM or pulse-code modulated data. Additionally, the data is time division multiplexed on the serial data stream into time slots for each communication channel. Because the distributed DMA of the present invention is particularly suited to support blocks of data for given channels, the serial port provides interleaving and deinterleaving of data from the serial data stream for each channel.

The serial DMA controller 207 couples to the system bus 200 through the bus arbitrator 201A to receive and transmit parallel bits of data. The serial DMA controller 207 couples to the telephone network to receive and transmit a serial data stream. The serial DMA controller 207 also includes DMA control signals to request and control the direct memory access through the system bus 200. These DMA control signals include DMA request (DMA REQ), DMA acknowledge (DMA ACK), interrupt request (INT), read/write strobe signal (R/W) which couple through the bus arbitrator 201A onto the control lines of the system bus 200. The DMA control signals are coupled to the control logic block 508. The control logic block 508 generates the DMA REQ, the INT, and the R/W strobe signals and receives the DMA ACK signal. The parallel data port of the serial data controller 207 couples to the bus arbitrator 201A. The receive FIFO buffer 502, the transmit FIFO buffer 504, the channel register, the data counter 506 and the status/control register 507 couple through the parallel data port of the serial DMA controller 207 to the bus arbitrator 201A. The receive FIFO buffer 502 and the transmit FIFO buffer 504 in one embodiment are one to two entries (64-bit) deep and provide burst writes and reads with the TDM remapper memory 5210 and the global buffer memory 210. The TDM remapper memory 510 of the serial DMA controller 207 couples through the multichannel serial data port to the telephone network to transmit and receive a serial data stream thereon.

The TDM remapper memory 510 provides a serial to parallel conversion when receiving a serial data stream from the telephone network. The TDM remapper memory 510 provides a parallel to serial conversion when transmitting a serial data stream onto the telephone network. The TDM remapper memory appropriately interleaves data into time slots of the serial data stream for transmission. The TDM remapper memory appropriately deinterleaves data from time slots of the serial data stream to received data. The TDM remapper memory 510 also remaps the appropriate data into memory locations so that multiple serial communication channels are supported. That is upon receiving serial data, the serial data stream is read into the TDM remapper memory by deinterleaving data from time slots into appropriate memory locations so that an entire frame of data for a given channel is ready for DMA into the global buffer memory. For transmitting serial data, an entire frame of data is stored into the TDM remapper memory so that it can be read out blocks at a time and interleaved into appropriate time slots for a given channel.

The status/control register 507 of the serial DMA controller provides status information regarding the serial port 206 and the serial DMA controller when read. The status/control register 507 maintains a number of flags including a receive FIFO buffer full flag and a transmit FIFO buffer full flag. When the buffer full flag is set, no further data can be stored in the respective buffer until the flag is cleared. The channel register 505 is set to a particular channel number when you want specific status regarding that channel. If a channel number is not selected by the channel register, general status is provided when the status/control register 507 is read. When writing to the status/control register 507, the control of the serial DMA controller 207 and the serial port 206 can be established or updated. The data counter 506 counts the byte count in a DMA transfer to determine when a transfer is completed. The count value of the data counter 506 also facilitates generation of addresses for the global buffer memory 210.

Referring now to FIGS. 6A and 6B, the functionality of the TDM remapping memory 510 is illustrated. FIG. 6A illustrates an exemplary serial data stream on the serial port of the multi-channel serial port 207. The serial data stream on the serial port is time division multiplexed (TDM). Communication channels (CH1 through CHN) are assigned designated time slots between frame synchronization pulses (FS) over Frame 1 through Frame M. Each channel time slot in one embodiment is one DS0 data byte of eight bits of data. In an alternate embodiment, each channel time slot is 16 bits of data. The present invention can be adapted to alternate bits of data per time slot per channel.

FIG. 6B illustrates an exemplary remapping of frames of data into data of the respective channels 1 through N or vice versa. The channel 1 data over Frames 1 through M is organized together. The channel 2 data over frames 1 through M is organized together and so on and so forth through channel N. For N communication channels M frames are stored into the TDM remapper memory. During reception, as soon as N DS0 words of channel 1 data is stored into the TDM remapper, one frame of channel 1 data can be written via DMA to the global buffer memory 210. The TDM remapper memory maps the DS0 words which are received into frames of data for each channel. During transmission, as soon as one frame of data is stored into the TDM remapper memory for each of N channels, one frame of serial TDM data can be transmitted to the telephone network. The TDM remapper memory maps the frame of data for the N channels into the DS0 words for each channel.

Figure 7:
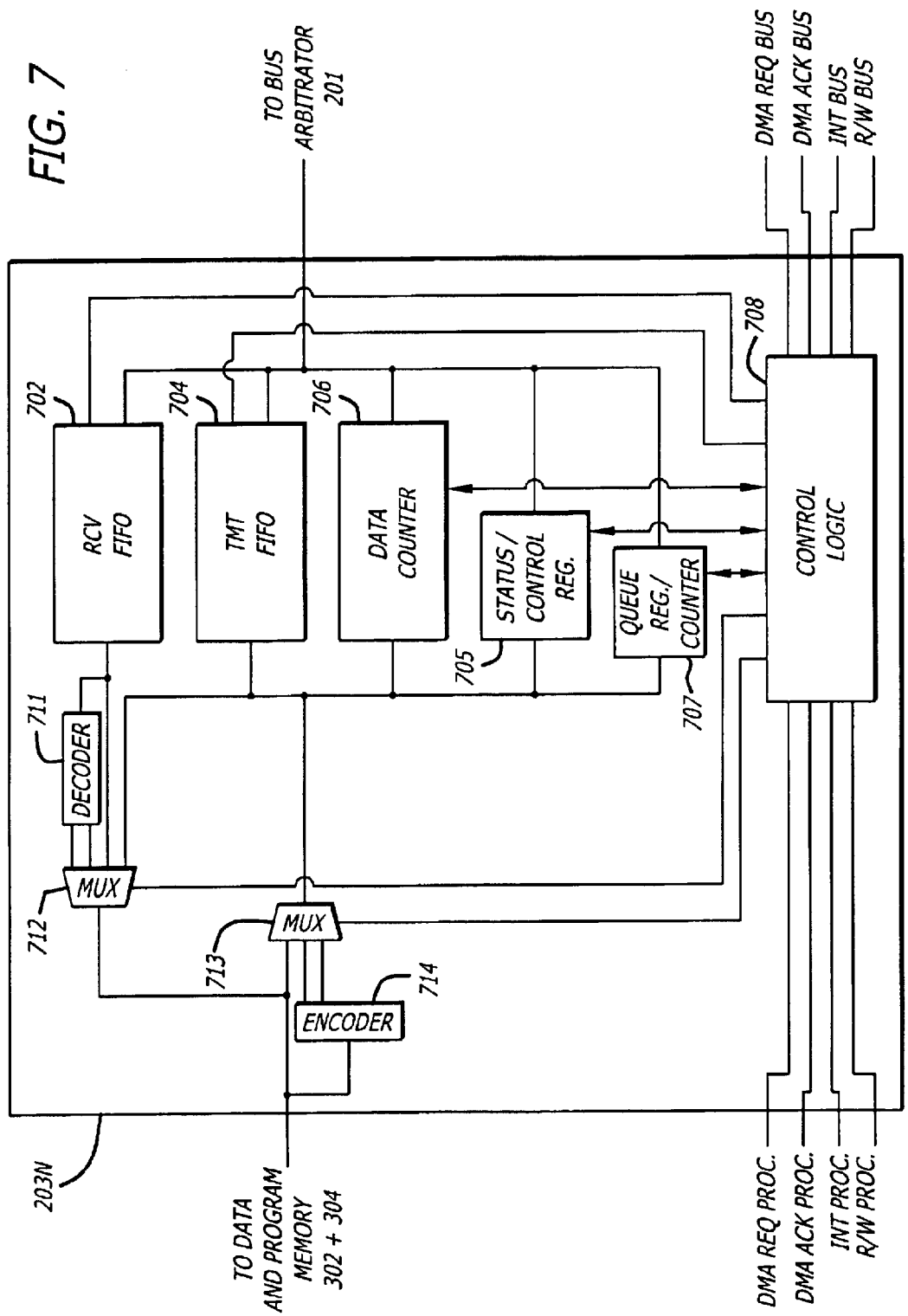
FIG. 7 is a block diagram of a core DMA controller of FIG. 2.

Referring now to FIG. 7, the block diagram of the core DMA controller 203 is illustrated. The core DMA controller 203 is one instance of the one or more core DMA controllers 203A–203N. The core DMA controller 203 includes a receive FIFO buffer 702, a transmit FIFO buffer 704, a status/control register 705, a data counter 706, a queue register/counter 707, control logic 708, a decoder 711, a pair of multiplexers 712–713, and an encoder 714. Control logic 708 has DMA control signals (DMA REQ PROC., DMA ACK PROC., INT PROC., and R/W PROC.) which couple on the processor side to the data memory 302 and program memory 304 for one connection and DMA control signals (DMA REQ BUS, DMA ACK BUS, INT BUS, and R/W BUS) on a bus side which couple through the system bus to the global buffer memory 210 for a second connection. The receive FIFO buffer 702, transmit FIFO buffer 704, status/control register 705, data counter 706, queue register/counter 707, decoder 711, and encoder 714 of the core DMA controller 203 couple on one side to the data memory 302 and program memory 304 of a core processor 200. The receive FIFO buffer 702, transmit FIFO buffer 704, status/control register 705, data counter 706, and queue register/counter 707 of the core DMA controller 203 couple to the global memory 210 through the one or more bus arbitrators 201A–201N and the system bus 200 on the bus side. The receive FIFO buffer 702 and the transmit FIFO buffer 704 in one embodiment are sixty-four bytes deep and provide burst writes and reads with the global buffer memory and the core processor.

Recall that in one embodiment of the present invention, the width of words of data stored into either channel of the data memory 302 is sixty four bits wide while the width of words of program code stored into either channel of the program memory 304 is forty bits wide. In which case, the core DMA controller 203 converts 64 bits of program code received from the global buffer memory 210 into forty bit word widths. Program code having a width of 64 bits is stored into eight 8-bit bytes into the receive FIFO. The program code is read from the receive FIFO by a processor such that five 8-bit bytes (i.e. 40 bits) of code are read out at a time and into the program memory 304. Alternatively, this can be viewed as five 64-bit words (320 bits) being stored into the receive FIFO and eight 40 bit words (320 bits) being read out of the receive FIFO.

Additionally, the core DMA controller can decompress data received from the global buffer memory before writing it into the data memory 304 and can compresses data read from the data memory 304 prior to writing it into the global buffer memory 210. The multiplexer 712 selects whether information from the receive FIFO buffer 702 is coupled directly through to the data memory and program memory or one of two decoded outputs from the decoder 711 decoding the information is coupled through. Multiplexer 712 also allows information from the data counter 706, the status/control register 705 and the queue register/counter 707 to be coupled to the processor or the data memory and program memory. Multiplexer 713 selects whether information from the data memory, the program memory or the DSP is coupled directly through to the transmit FIFO buffer 702 or if one or two encoded outputs from the encoder 714 encoding the information is coupled through. In one embodiment, the compressed format can be either A-law or Mu-law non-linear compressed formats while the decompressed format is linear or pulse code modulated data. The compression and decompression is selected by setting bits in the status/control register 705 in response to a DMA descriptor list.

By encoding (compressing) and decoding (decompressing) data within the core DMA controller, the data from the serial port can remain compressed from the serial port over the system bus into the global buffer memory and then into the core DMA controller through the system bus. Keeping the data compressed within the SOC 100 for as long as possible provides increased bandwidth for data transfer.

The status/control register 705 of the core DMA controller provides status information regarding the respective core processor 200 and the core DMA controller when read. The status/control register 705 maintains a number of flags including a receive FIFO buffer full flag and a transmit FIFO buffer full flag. When the buffer full flag is set, no further data can be stored in the respective buffer until the flag is cleared. When writing to the status/control register 705, the control of the core DMA controller 203 can be established or updated. The data counter 706 counts the byte count in a DMA transfer to determine when a transfer is completed. The count value of the data counter 706 also facilitates generation of addresses for the global buffer memory 210.

In the DMA of data between global buffer memory and data memory or program memory of a core processor, each of the core DMA controllers uses the same DMA descriptor list which was used to DMA the data from host port or serial port into the global buffer memory. An additional DMA descriptor list is unnecessary.

Figure 8:
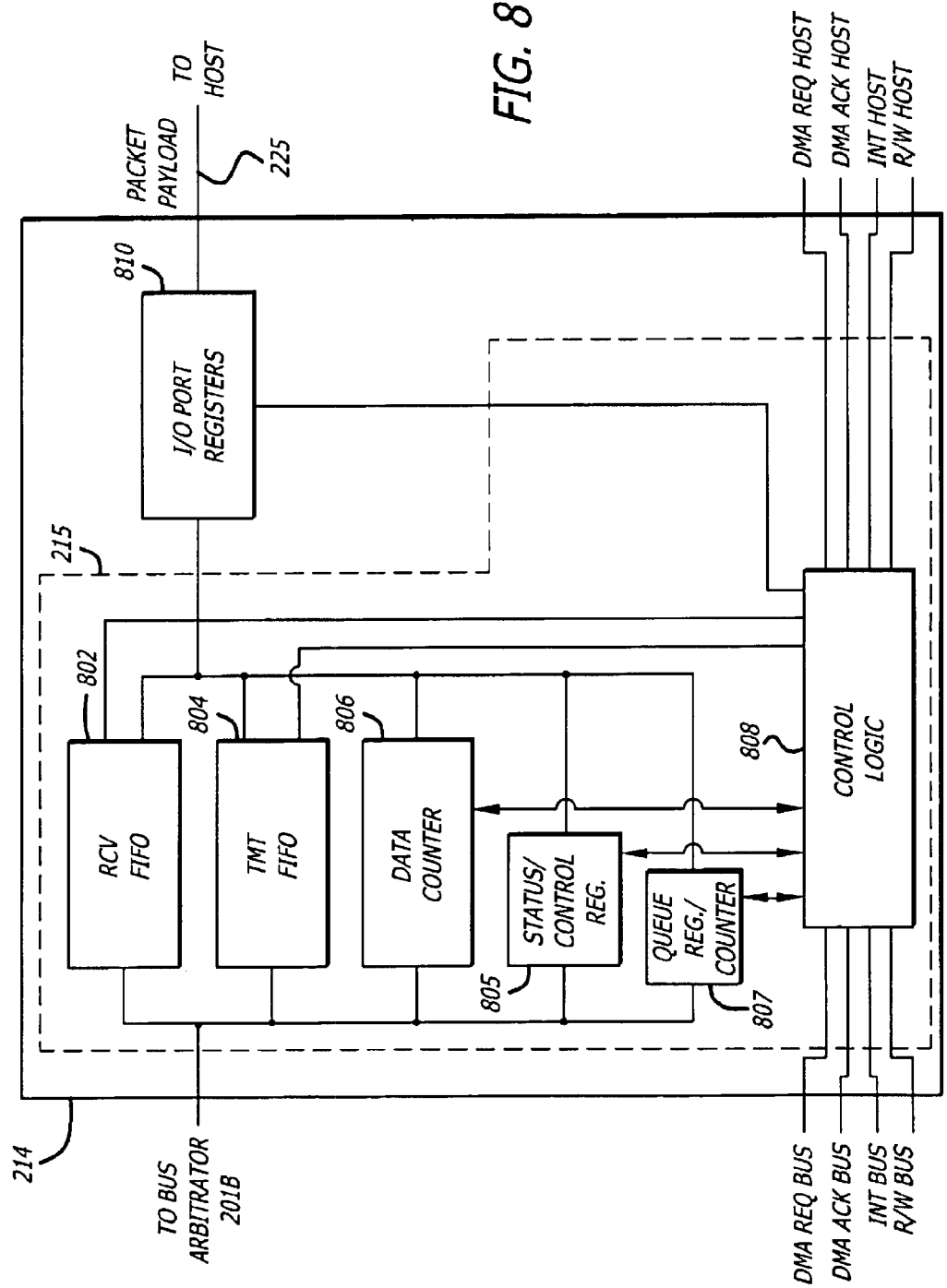
FIG. 8 is a block diagram of a host DMA controller of FIG. 2.
Figure 8:
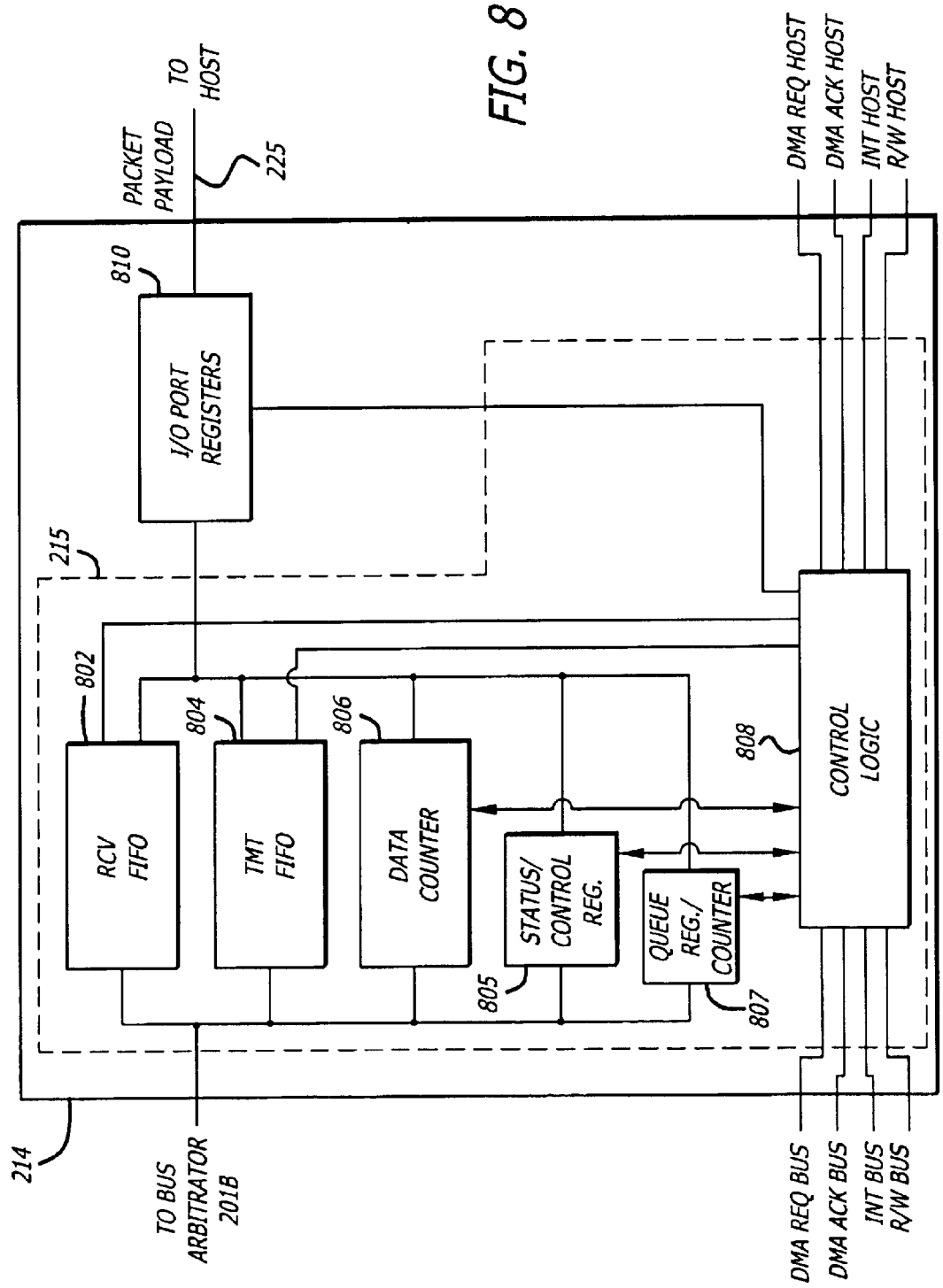

Referring now to FIG. 8, the host port 214 is illustrated including the host DMA controller 215. The host DMA controller 215 includes a receive FIFO buffer 802, a transmit FIFO buffer 804, a status/control register 805, a data counter 806, a queue register/counter 807, control logic 808 providing flow control, and I/O port registers. The control logic 808 includes logic to provide data flow control and to provide DMA control structures. The DMA control structures serve as queue handles. The status/control register 807 provide access to control and status information to an external host and status notification and queue counter information to the internal microcontroller 223. The receive FIFO buffer 802 and the transmit FIFO buffer 804 in one embodiment are sixty-four bytes deep. The receive FIFO buffer 802 and the transmit FIFO buffer 804 provide burst writes and reads between a host processor and the SOC 100. The host port 214 illustrated in FIG. 8 further includes the I/O port registers 810 to selectively interface to a host processor. The control logic 808 of the DMA controller 215 has DMA control signals (DMA REQ BUS, DMA ACK BUS, INT BUS, and R/W BUS) on the bus side which couple to the global buffer memory 210 through the arbitrator 201 and system bus 200. Control logic 808 has DMA control signals (DMA REQ HOST, DMA ACK HOST, INT HOST, and R/W HOST) on the host side which couple to the host. The receive FIFO 802, the transmit FIFO 804, the data counter 806, status/control register 805, and queue register/counter 807 are coupled on one side to the bus arbitrator 201. The receive FIFO 802, the transmit FIFO 804, and the data counter 806 are coupled on an opposite side to the I/O buffer 810. In this manner, parallel data of packet payloads can flow between the host and the system bus 200 into and out of the global buffer memory 210.

The I/O port registers 810 of the host port 214 provides a point for a host processor to write data and to read data.

The status/control register 805 of the host DMA controller 215 provides status information regarding the host port 214 and the host DMA controller 215 when read. The status/control register 805 maintains a number of flags including a receive FIFO buffer full flag and a transmit FIFO buffer full flag. When the buffer full flag is set, no further data can be stored in the respective buffer until the flag is cleared. When writing to the status/control register 805, the control of the host MDA controller 215 and the host port 214 can be established or updated. The data counter 806 counts the byte count in a DMA transfer to determine when a transfer is completed. The count value of the data counter 806 also facilitates generation of addresses for the global buffer memory 210.

The preferred embodiments of the present invention are thus described. As those of ordinary skill will recognize, the present invention has many advantages. One advantage of the present invention is that the bandwidth to the global buffer memory is increased due to the wide system bus, the remapping of serial data, and compression/decompression of data on the fly. Another advantage of the present invention is that arbitration is simplified by using common standards for bus arbitration and is improved due to the distribution of direct memory access controllers.

While the present invention has been described in a particular embodiment of a voice over packet system on a chip, it is equally applicable to other systems on chips. Additionally, the present invention may be implemented in hardware, software, firmware or a combination thereof and utilized in systems, subsystems, components or sub-components thereof. When implemented in software, the elements of the present invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. In any case, the present invention should not be construed as limited by such embodiments, but rather construed according to the claims that follow below.

What is claimed is:

1. A voice over packet system on a chip comprising:
   a buffer memory;
   a system bus coupled to the buffer memory;
   a plurality of bus arbitrators coupled to the system bus;
   a plurality of functional modules coupled to the plurality of bus arbitrators, each of the plurality of functional modules has a DMA controller to couple to a bus arbitrator of the plurality of bus arbitrators, the DMA controller to provide direct memory access to the buffer memory;
   wherein the plurality of functional modules includes
      one or more signal processors to process data of a plurality of communication channels, the one or more signal processors to directly memory access the buffer memory to read data for processing and to write data after processing,
      a host port to couple to a packet network and transmit and receive packet payloads with the packet network and to directly memory access the buffer memory to read data from and write data into the buffer memory, and
      a multichannel serial port to couple to a telephone network and transmit and receive data with the telephone network and to directly memory access the buffer memory to read data from and write data into the buffer memory.

2. The voice over packet system on a chip of claim 1, wherein
   the plurality of bus arbitrators negotiate access to the system bus by the plurality of functional modules.

3. The voice over packet system on a chip of claim 1, further comprising:
   a microcontroller coupled to the system bus.

* * * * *